United States Patent
Imamura et al.

(10) Patent No.: US 7,976,807 B2
(45) Date of Patent: Jul. 12, 2011

(54) METHOD FOR DETOXIFYING HCD GAS AND APPARATUS THEREFOR

(75) Inventors: Hiroshi Imamura, Nagaokakyo (JP); Hiroaki Takeuchi, Tokyo (JP); Koji Ishikawa, Nagoya (JP); Hiroshi Suzuki, Nagoya (JP); Akira Moriya, Nagoya (JP); Katsuyoshi Harada, Tokyo (JP)

(73) Assignees: Kanken Techno Co., Ltd., Kyoto (JP); Toagosei Co., Ltd., Tokyo (JP)

( * ) Notice: Subject to any disclaimer, the term of this patent is extended or adjusted under 35 U.S.C. 154(b) by 295 days.

(21) Appl. No.: 12/224,508

(22) PCT Filed: Feb. 6, 2007

(86) PCT No.: PCT/JP2007/051964
§ 371 (c)(1),
(2), (4) Date: Aug. 28, 2008

(87) PCT Pub. No.: WO2007/102288
PCT Pub. Date: Sep. 13, 2007

(65) Prior Publication Data
US 2009/0104100 A1 Apr. 23, 2009

(30) Foreign Application Priority Data
Mar. 7, 2006 (JP) .................... 2006-061171

(51) Int. Cl.
*B01D 53/68* (2006.01)

(52) U.S. Cl. .............. 423/240 R; 423/481; 423/488; 423/335; 423/336; 423/337

(58) Field of Classification Search .......... 423/240 R, 423/481, 488, 335, 336, 337
See application file for complete search history.

(56) References Cited

U.S. PATENT DOCUMENTS

| | | | |
|---|---|---|---|
| 5,766,342 A * | 6/1998 | Shibuya et al. | 117/54 |
| 6,905,663 B1 * | 6/2005 | Arno | 423/240 R |
| 2002/0090323 A1* | 7/2002 | Kim | 422/168 |
| 2002/0187096 A1* | 12/2002 | Kendig et al. | 423/350 |
| 2006/0223308 A1* | 10/2006 | You et al. | 438/641 |
| 2009/0020140 A1* | 1/2009 | Wan et al. | 134/13 |

FOREIGN PATENT DOCUMENTS

| | | |
|---|---|---|
| JP | 62-158321 A | 7/1987 |
| JP | 11-033345 | 2/1999 |
| JP | 2002-166128 A | 6/2002 |
| JP | 2005-152858 A | 6/2005 |
| JP | 2005-199215 A | 7/2005 |

* cited by examiner

*Primary Examiner* — Ngoc-Yen M Nguyen
(74) *Attorney, Agent, or Firm* — Kubotera & Associates, LLC

(57) ABSTRACT

Hexachlorodisilane is decomposed into hydrochloric acid, silicon dioxide and water by introducing hexachlorodisilane-containing flue gas into a reaction region without moistening the flue gas and by supplying oxygen-containing gas that also contains a small amount of moisture to the reaction region maintained at a temperature at which hexachlorodisilane decomposes.

1 Claim, 4 Drawing Sheets

METHOD FOR DETOXIFYING HCD GAS AND APPARATUS THEREFOR

BACKGROUND OF THE INVENTION

1. Field of the Invention

The present invention relates to a method for detoxifying flue gas containing hexachlorodisilane (hereinafter referred to as "HCD") for deposition that is discharged from a CVD (chemical vapor deposition) apparatus in the production of semiconductors, and to a detoxifying apparatus therefor.

2. Description of the Related Art

Flue gas containing several substances is discharged from a CVD apparatus, which is a silicon wafer production equipment. Some of the substances are explosive or toxic, and the flue gas needs to be detoxified before being released into the atmosphere. A detoxifying apparatus is connected to the CVD apparatus, and is for detoxifying the flue gas containing a toxic substance discharged from the CVD apparatus. JP H11-33345A discloses such the apparatus.

Gases used in the CVD apparatus are classified according to usage, e.g., for deposition, for cleaning, for etching and the like, and there are several types of gases depending on use. HCD has been newly developed as deposition gas.

HCD is represented by the chemical formula "$Si_2Cl_6$". When HCD is subjected to a hydrolysis reaction at room temperature, silico-oxalic acid (reactive silica, chemical formula: $(SiOOH)_2$) is formed. The silico-oxalic acid is explosive and is an extremely dangerous substance.

$$Si_2Cl_6 + 4H_2O \rightarrow (SiOOH)_2 + 6HCl \quad \text{Formula 1}$$

On the other hand, when HCD is subjected to thermolysis in the absence of water (hereinafter referred to as nonaqueous), the following reactions occur:

(a) Nonaqueous•anaerobic: $2Si_2Cl_6 \rightarrow 3SiCl_4 + Si$
(b) Nonaqueous•aerobic: $Si_2Cl_6 + 2O_2 \rightarrow 2SiO_2 + 3Cl_2$ When $Si_2Cl_6$ is subjected to thermolysis in the presence of oxygen, chlorine is generated as shown in (b). Then the chlorine corrodes a detoxifying apparatus (1). To prevent chlorine generation, a certain amount of moisture is required, but if there is an excessive amount of water, silico-oxalic acid is generated as described above.

SUMMARY OF THE INVENTION

An object of the present invention is to develop a method for thermally decomposing HCD that generates neither silico-oxalic acid, which is explosive, nor chlorine gas, which is toxic and corrosive, and an apparatus therefor.

A first aspect in accordance with the present invention, a detoxifying method comprises the steps of introducing hexachlorodisilane-containing flue gas (L) into a reaction region (K) without moistening the discharge gas while supplying oxygen-containing gas (G) that contains moisture to the reaction region (K), and oxidatively decomposing at least the hexachlorodisilane contained in the flue gas (L) in the reaction region (K).

A second aspect in accordance with the present invention, a detoxifying apparatus (1) for performing the aforementioned method comprises a reactor (6) connected to a semiconductor producing apparatus that discharges hexachlorodisilane-containing flue gas (L) without moistening the flue gas, the reactor (6) having a reaction region (K) in which the flue gas (L) is thermally decomposed, a moisture-containing oxygen gas supply unit (5) that supplies moisture- and oxygen-containing gas (G) to the reaction region (K) of the reactor (6), a scrubber (7) that washes with water a treated gas (H) discharged from the reactor (6), and a water tank (4) that collects washing water (8)".

According to the present invention, HCD can be decomposed into hydrochloric acid, silicon dioxide and water by introducing oxygen-containing gas (usually air (G)) that contains a small amount of moisture and HCD-containing flue gas (L) into a reaction region (K) maintained at the decomposition temperature of HCD without generating acid and chlorine, thereby enabling a treatment of HCD-containing flue gas to be safely carried out.

DETAILED DESCRIPTION OF THE INVENTION

Figure 1:
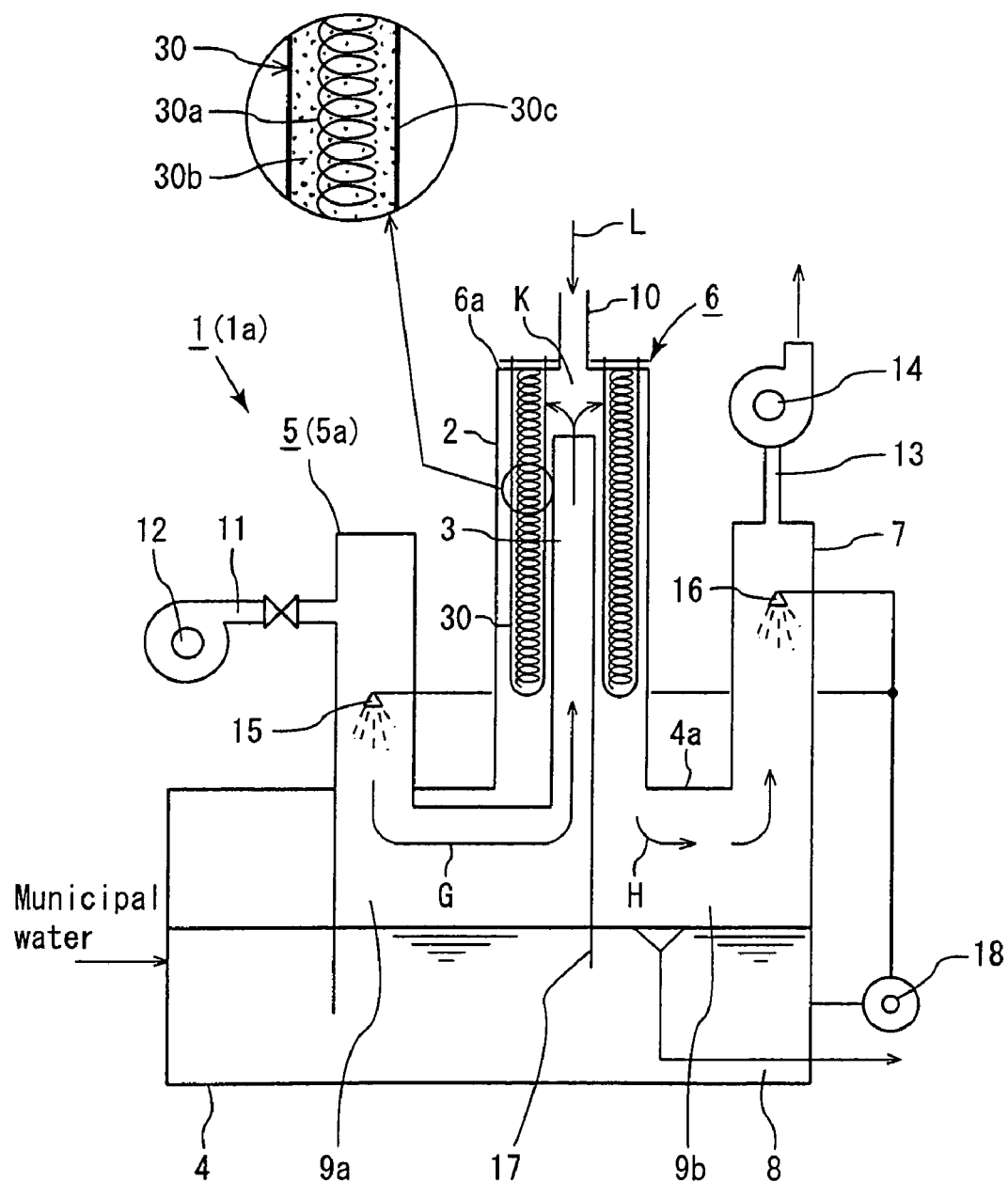
FIG. 1 is a schematic structural drawing of an apparatus according to the first embodiment of the present invention.

A discharge gas pipe (10) through which the discharge gas (L) discharged from each treatment process (not shown) of a CVD apparatus (not shown) passes is connected to the detoxifying apparatus (1). In the first embodiment, one or more heaters (30) are suspended from the ceiling part of the reactor (6) around an inner cylinder (3) (the heaters (30) may be installed upright on the floor surface of the reactor (6)). In the second embodiment and the third embodiment, the inner cylinder (3) functions as a heater.

Ceramic heaters are used for the heaters (30) of FIG. 1. A sheathed heater composed of a sheath (30c) made of nickel (or a nickel alloy such as hastelloy), a heating element (30a, for example, nickel-chrome wire) disposed in the sheath, and insulating material (30b) filled in the sheath may be used. The second embodiment and the third embodiment are different from the first embodiment with respect only to the route of the moisture- and oxygen-containing gas (G) into the reactor (16).

The first embodiment may be configured to have a different route of the moisture- and oxygen-containing gas (G) into the reactor (16) in view of the second and third embodiments. Other configurations are nearly the same, and therefore the same reference numbers are given to the components that have the same functions. Descriptions are given with respect mainly to the first embodiment. In the second and third embodiments, only the components that are different from those in the first embodiment are described, and the descriptions of the components that are the same as in the first embodiment use the descriptions given in the first embodiment.

The detoxifying apparatus (1) comprises a water tank (4) disposed in the lower part, the reactor (6) disposed upright in the center in the upper part of the water tank (4), a moisture-containing air supply column (5a) disposed adjacent to the reactor (6), and a scrubber (7) disposed opposite the moisture-containing air supply column (5a).

The inner cylinder (3) is placed at the center of the reactor (6) of the detoxifying apparatus (1). The heaters (30) suspended from the top part (6a) of the reactor (6) are arranged so as to surround the inner cylinder (3) or extend along the inner cylinder (3). The heaters may be arranged such that the upper surface (4a) of the water tank (4) is extended into the reactor (6) so as not to hinder the flow of gas in the reactor (6), and the heaters are installed upright from the floor part of the portion extending into the reactor (6) so as to surround or extend along the inner cylinder (3).

Figure 2:
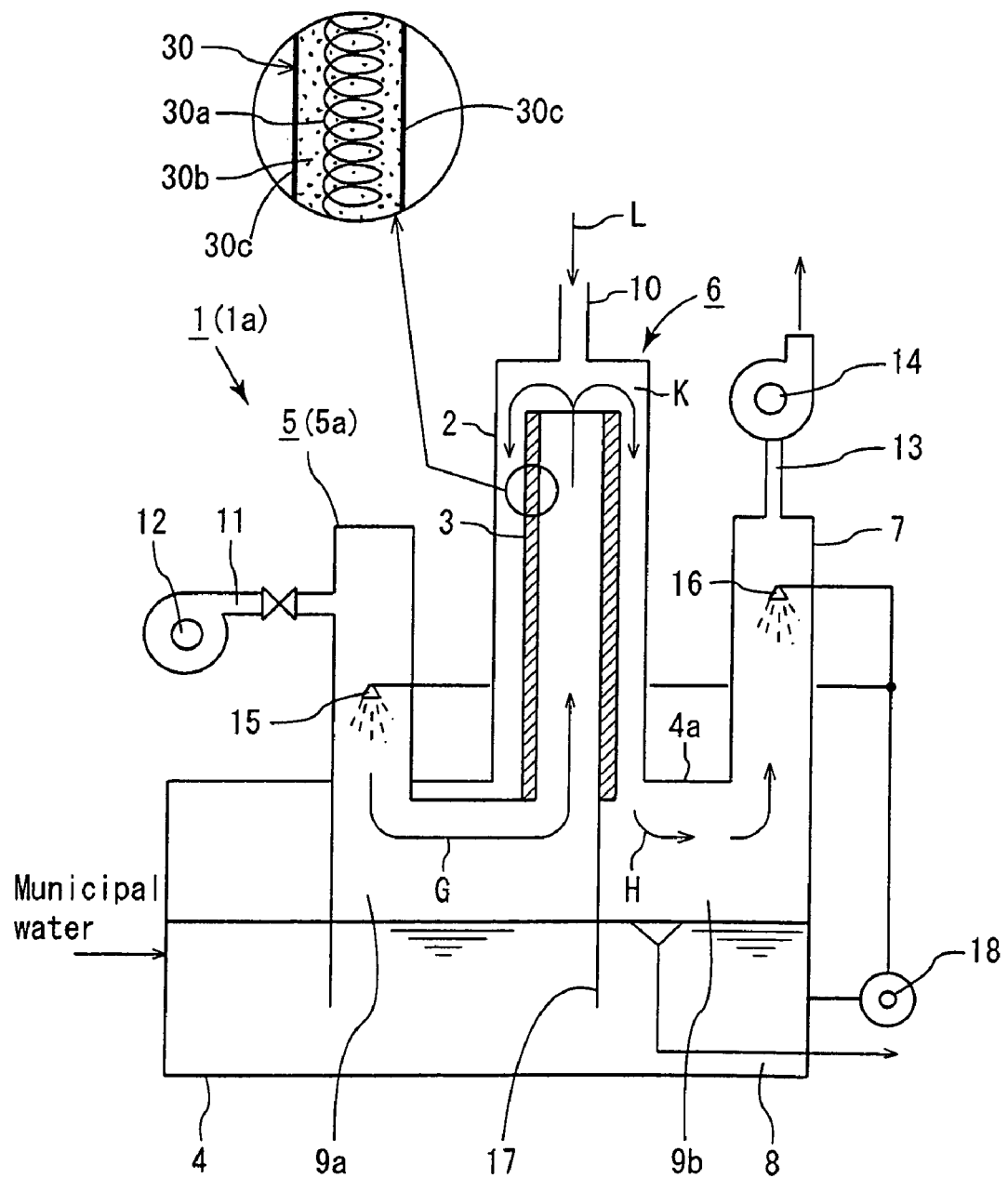
FIG. 2 is a schematic structural drawing of an apparatus according to the second embodiment of the present invention.
Figure 3:
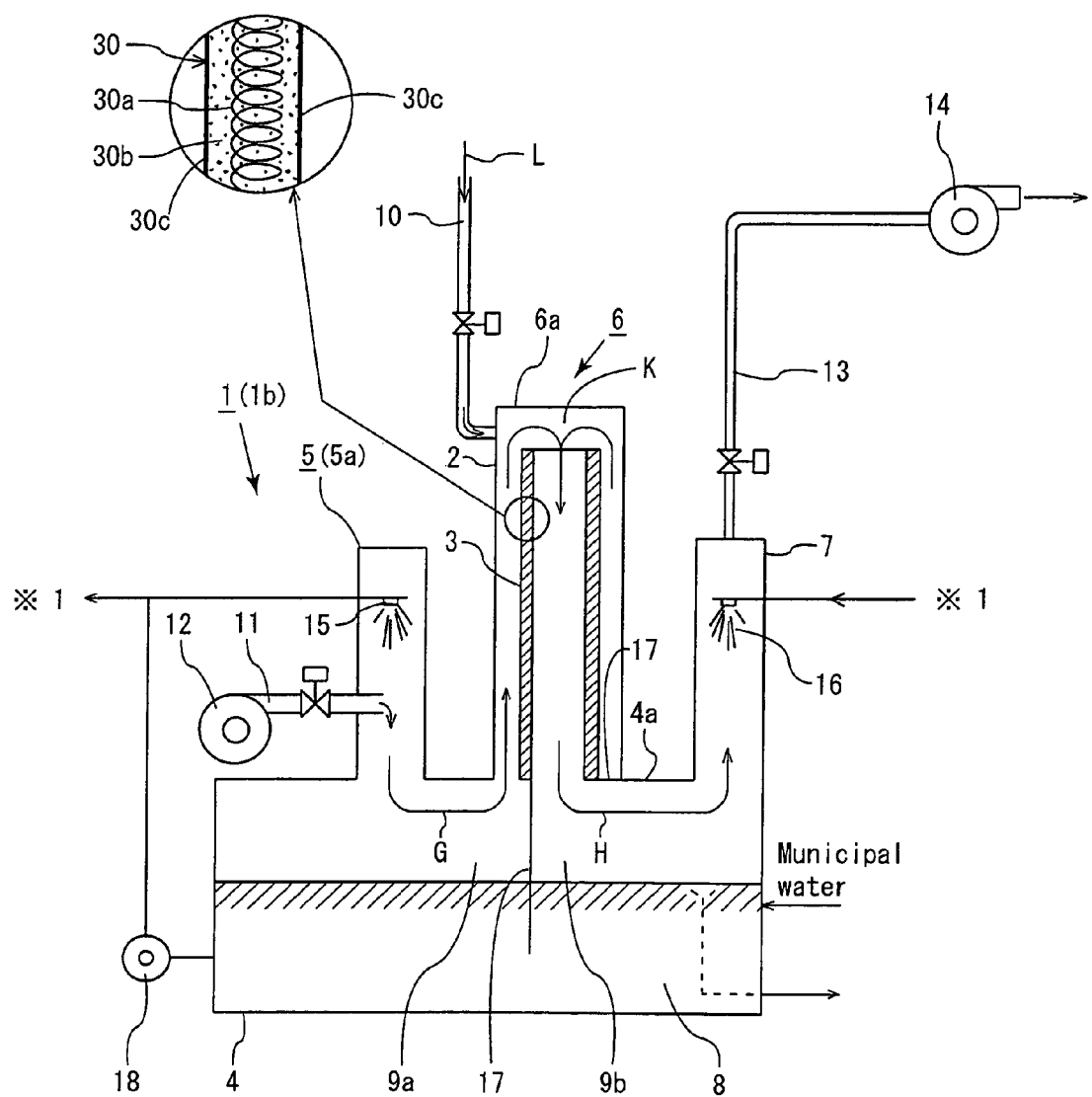
FIG. 3 is a schematic structural drawing of an apparatus according to the third embodiment of the present invention.

The inner cylinder (3) can be composed of a cylindrical component made of ceramic (material may be alumina or mullite, for example), nickel or a nickel alloy such as hastelloy; cylinder (3) with a heater is provided as shown in the enlarged drawings in FIGS. 2 and 3 ("30a" indicates a heating element, "30b" indicates insulating material and "30c" indicates an inner/outer cover corresponding to the sheath); or a cylindrical ceramic heater. With respect to the inner cylinder (3) with the heater is provided, the inner/outer cover (30c) is composed of alumina, mullite, nickel or a nickel alloy such as hastelloy, and the heating element (30a) (a heating wire such as a nickel-chrome wire) is disposed inside. The inner cylinder is filled with the insulating material (30b). The inner cylinder (3) is installed upright from the bottom part of the reactor (6) toward the top of the reactor, and is designed such that the top part has the highest temperature.

The outer cylinder (2) is a thermal insulation structure of which the inner surface is formed with ceramics composed of alumina or mullite and the entire periphery is covered with insulating material. The inner surface of the outer cylinder (2) may be formed with nickel or a nickel alloy such as hastelloy. In addition, the inner surface may be a ceramic heater (the inner surface of the outer cylinder (2) serves as a ceramic heater). The outer cylinder (2) may be a built-in heater. In the case of the built-in heater, a thermal insulation structure in which insulating material is filled between the inner cover made of nickel or a nickel alloy such as hastelloy and the insulating material provided outside thereof. And a heating element, such as a nickel-chrome wire that is filled in the insulating material (the same structure as shown in the enlarged drawings in FIGS. 2 and 3).

The inner cylinder (3), the outer cylinder (2) and the heater (30) having a configuration as described above can be used in combination as the inner cylinder (3), the outer case (2) and the heater (30). In the case of the ceramic part of the inner surface of the outer cylinder (2) and the inner cylinder (3) are both ceramic heaters, or a heating element is provided in the inner surface of the outer cylinder (2) and the inner cylinder (3), the space enclosed by the outer cylinder (2) and the inner cylinder (3) is heated from inside and outside. And the space from near the top end part of the inner cylinder (3) to the top end of the inner part of the reactor (6) is risen to the highest temperature when the detoxifying apparatus (1) is in operation. Thereby, the space forms the reaction region (K) where the efficiency of heat radiation and heat conduction to the flue gas (L) is extremely high. This point is also applicable to the second and third embodiments.

A discharge fan (14) is provided downstream of a discharge pipe (13) extending from the scrubber (7) of the detoxifying apparatus (1). The discharge fan (14) reduces the pressure within the detoxifying apparatus (1), and thus the flue gas (L) from each treatment process of the CVD apparatus is brought into the reaction region (K) located in the top part (6a) of the reactor (6). Further, a water spray nozzle (16) is provided in the scrubber (7), and water in the form of a mist is sprayed from the water spray nozzle (16) in the scrubber (7).

In this embodiment, the moisture-containing air supply column (5a) functions as the moisture-containing oxygen gas supply unit (5). A spray (15) is provided in the top part of the moisture-containing air supply column (5a), and water in the form of a mist is sprayed from the spray (15) into the moisture-containing air supply column (5a). In addition, an outside air introducing pipe (11) is provided upstream of the spray (15). An outside air introducing fan (12), attached to the outside air introducing pipe (11), introduces outside air in an amount always maintained at least twice that of the theoretical amount required to oxidatively decompose the flue gas (L) into the moisture-containing air supply column (5a).

The water tank (4) stores washing water (8) therein. Spaces (9a) and (9b) are provided between the upper surface (4a) of the water tank (4) and the surface of the washing water (8). A partition (17) that separates the space (9a) on the moisture-containing air supply column (5a) side from the space (9b) on the scrubber (7) side is provided in the bottom part of the inner cylinder (3) of the reactor (6). The lower end of the partition (17) is positioned in the washing water (8). As shown in the drawing, the lower end of the partition (17) does not reach the bottom of the water tank (4), and thus the washing water (8) can move freely in the space (9a) and (9b)

Water pumped from the water tank (4) with a water pump (18) is supplied to the spray (15) of the moisture-containing air supply column (5a) and the water spray nozzle (16) of the scrubber (7). Moreover, clean municipal water is supplied as necessary (or always) to the water tank (4), and used as washing water (8) which is discharged according to the amount of municipal water supplied.

By sending electricity to the heaters (30), the contact temperature in the reaction region (K) and at the surface of the top part of the inner cylinder (3) is increased to a predetermined temperature (500-800° C.). Subsequently, or simultaneously, the outside air introducing fan (12), the discharge fan (14) and the water pump (18) are activated.

Thereby, moisture is added to the outside air (not limited to outside air but any gas insofar as containing oxygen), introduced into the moisture-containing air supply column (5a), and the air is forwarded to the space (9a) as moist air. Conversely, a negative pressure is created on the space (9b) side by the discharge action of the discharge fan (14), and thus the air in the detoxifying apparatus (1) flows smoothly along the path, i.e., moisture-containing air supply column (5a)→space (9a)→inner cylinder (3)→reaction region (K)→space between the outer cylinder (2) and the inner cylinder (3)→space (9b)→scrubber (7) (FIG. 1; see the first example). When the flow of air in the detoxifying apparatus (1) reaches a steady state, the flue gas (L) containing HCD is introduced into the upper part of the reactor (6) from the discharge gas pipe (10).

The second embodiment shown in FIG. 2 is different from the first embodiment with respect to the inner cylinder (3) in which heaters are provided or that is itself a ceramic heater, and the other components are the same as in the first embodiment. The detoxifying apparatus (1) of the second embodiment is, therefore, operated according to the same procedure as with the detoxifying apparatus (1) of the first embodiment. That is, the air in the detoxifying apparatus (1) flows smoothly along the path: moisture-containing air supply column (5a) →space (9a)→inner cylinder (3)→reaction region (K)→space between the outer cylinder (2) and the inner cylinder (3)→space (9b)→scrubber (7). When this flow of air reaches a steady state, the flue gas (L) containing HCD is introduced into the upper part of the reactor (6) from the discharge gas pipe (10). The flow of air in the detoxifying apparatus (1) in the third embodiment shown in FIG. 3 is slightly different compared with the first and second embodiment. The air in the detoxifying apparatus (1) flows along the path: moisture-containing air supply column (5a)→space (9a)→space between the outer cylinder (2) and the inner cylinder (3)→reaction region (K)→inner cylinder (3)→space ($9b$)→scrubber (7). When the air in the detoxifying apparatus (1) flows smoothly and this flow reaches a steady state, the flue gas (L) containing HCD is introduced into the upper part of the reactor (6) from the discharge gas pipe (10).

The high-temperature region (that is, the reaction region (K)) from near the top end part of the inner cylinder (3) to the top end of the inside of the reactor (6) is maintained at a temperature necessary for oxidatively decomposing the flue gas (L) containing HCD (hexachlorodisilane: $Si_2Cl_6$) gas, and HCD is decomposed into water and silicon dioxide in the presence of moist air.

$$Si_2Cl_6 + 4H_2O \rightarrow (SiOOH)_2 + 6HCl \qquad \text{Formula 2}$$

$$2(SiOOH)_2 + O_2 \rightarrow 2H_2O + 4SiO_2 \qquad \text{Formula 3}$$

HCD starts to be decomposed at 350° C. and is completely decomposed at 800° C. On the other hand, the optimum temperature at which silico-oxalic acid is not generated is 500° C. or more. Therefore, it is preferable that the temperature of the reaction region (K) of the detoxifying apparatus (1) is set to 500° C. or more.

Silicon dioxide is generated as fine dust and reaches inside the scrubber (7) from the reaction region (K) through the space between the outer cylinder (2) and the inner cylinder (3) in the first and second embodiments, or from the reaction region (K) through the inside of the inner cylinder (3) in the third embodiment, and through the space ($9b$), is cooled and caught with the water sprayed from the water spray nozzle (16), then falls into the washing water (8) in the space ($9b$), and is collected. At the same time, various water-soluble gases and gases resulting from hydrolysis are removed by washing. The treated gas (H) cleaned in this manner is released into the atmosphere by the discharge fan (14).

Figure 4:
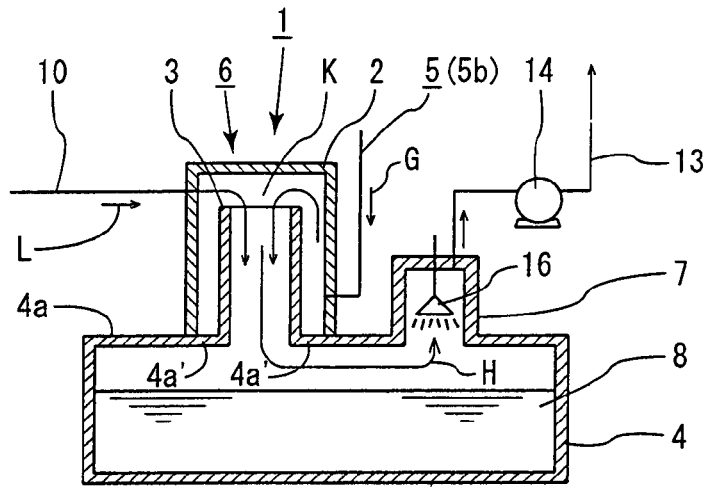
FIG. 4 is a schematic structural drawing of an apparatus according to the fourth embodiment of the present invention.
Figure 5:
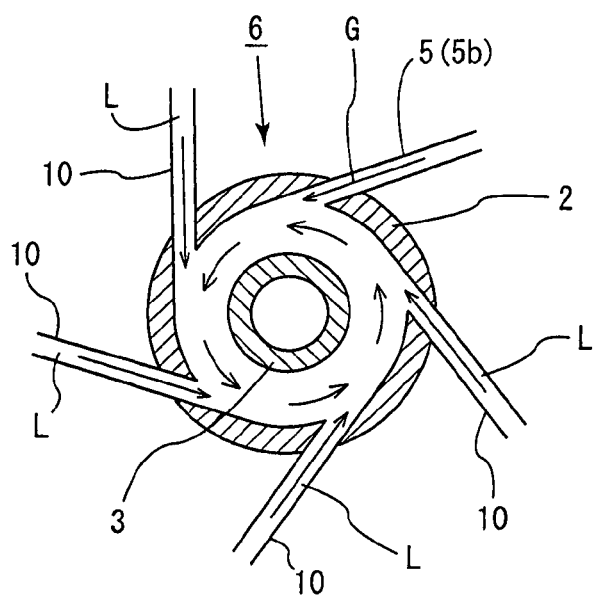
FIG. 5 is a transverse cross-sectional drawing of the reactor of FIG. 4.

FIGS. 4 and 5 show another embodiment of the detoxifying apparatus (1) (the fourth embodiment) according to the present invention. The discharge gas pipes (10) are connected to the upper part of the reactor (6) in the tangential directions from the circumference of the outer cylinder (2) (see FIG. 5). Thereby, the flue gas treatment can be performed while the flue gas (L) from a plurality of treatment processes is introduced into the detoxifying apparatus (1) through the discharge gas pipes (10). In the fourth embodiment, the moisture-containing air supply column (5a) that functions as the moisture-containing oxygen gas supply unit (5) is not provided. The fourth embodiment is configured such that water vapor is supplied to the lower part of the reactor (6) directly from a vapor pipe (5b) that functions as the moisture-containing oxygen gas supply unit (5). The moisture-containing air supply column (5a) may also be provided.

In the fourth embodiment, the lower end of the outer cylinder (2) is closed by the upper surface (4a') of the water tank (4), and the upper surface (4a') part of the water tank (4) that closes the lower end of the outer cylinder (2) corresponds to the partition (17) in the first through third embodiments. Other than the point described above, the fourth embodiment is the same as the first through third embodiments, and thus the descriptions of the first through third embodiments are used for the descriptions of the fourth embodiment.

According to the present invention, the flue gas that contains HCD which is a newly developed deposition gas can be safely decomposed, and thus the present invention can contribute to the further development of semiconductor production.

The foregoing description of embodiments of the invention have been presented for purposes of illustration and description. It is not intended to be exhaustive or to limit the invention to the precise form disclosed, and modifications and variation are possible in light of the above teachings or may be acquired from practice of the invention. The embodiment was chosen and described in order to explain the principles of the invention and its practical application to enable one skilled in the art to utilize the invention in various embodiments and with various modification as are suited to the particular use contemplated. It is intended that the scope of the invention be defined by the claims appended hereto and their equivalents.

What is claimed is:

1. A detoxifying method comprising the steps of:
   introducing a flue gas containing hexachlorodisilane into a reaction region formed within a reactor without moistening the flue gas;
   supplying a gas that contains moisture and oxygen to the reaction region through an inner cylinder disposed in the reactor; and
   oxidatively decomposing at least the hexachlorodisilane contained in the flue gas in the reaction region,
   wherein the gas that contains moisture and oxygen is supplied to a portion of the reaction region having a highest temperature near an end of the inner cylinder after passing through the inner cylinder and being heated by the heat generated from the flue gas oxidatively decomposing step.

\* \* \* \* \*